United States Patent [19]
Mito et al.

[11] Patent Number: 4,597,085
[45] Date of Patent: Jun. 24, 1986

[54] DOUBLE-CHANNEL PLANAR HETEROSTRUCTURE SEMICONDUCTOR LASER

[75] Inventors: Ikuo Mito; Kohroh Kobayashi; Tetsuhiko Ikegami, all of Tokyo, Japan

[73] Assignees: NEC Corporation; Nippon Telegraph & Telephone Public Corporation, both of Japan

[21] Appl. No.: 532,629

[22] Filed: Sep. 15, 1983

[30] Foreign Application Priority Data

Sep. 27, 1982 [JP] Japan .................................. 57-167963

[51] Int. Cl.$^4$ .................................................. H01S 3/19
[52] U.S. Cl. ........................................ 372/45; 357/17; 372/46; 372/48
[58] Field of Search ....................... 372/44, 45, 46, 48; 357/17

[56] References Cited

U.S. PATENT DOCUMENTS 4,425,650 1/1984 Mito et al. ........................... 372/46

OTHER PUBLICATIONS

Tsang et al., "A New Lateral Selective-Area Growth by Liquid-Phase Epitaxy: The Formation of a Lateral Double-Barrier Buried-Heterostructure Laser", *Appl. Phys. Lett.*, 40(11) Jun. 1, 1982, p. 942.

Primary Examiner—James W. Davie
Attorney, Agent, or Firm—Sughrue, Mion, Zinn, Macpeak, and Seas

[57] ABSTRACT

A double-channel planar buried-heterostructure semiconductor laser diode (DC-PBH LD) has improved high frequency response characteristics due to lower p-n junction capacitance resulting from the interposition of a low carrier concentration blocking layer between p-n-p-n blocking layers of the DC-PBH LD structure.

3 Claims, 5 Drawing Figures

DOUBLE-CHANNEL PLANAR HETEROSTRUCTURE SEMICONDUCTOR LASER

BACKGROUND OF THE INVENTION

The present invention relates to buried-heterostructure semiconductor lasers and, more particularly, to one which has desirable frequency characteristics.

Buried heterostructure semiconductor lasers have various features such as low oscillation threshold, linear injection current to light output characteristic, stable fundamental lateral mode operation and high-temperature operation capability.

A prior art double-channel planar buried-heterostructure laser diode (abbreviated as DC-PBH LD hereinafter) is shown in FIG. 1. The illustrated type of DC-PBH LD has a p-n-p-n current confinement structure thereinside which enhances current concentration to an active stripe region. Such a laser diode, using a InGaAsP system with InP substrates, shows various outstanding characteristics which are an oscillation threshold of 15–30 mA, light output larger than 50 mW, a maximum CW operable temperature of 120° C., etc., each measured at a 1.3 $\mu$m oscillation wavelength band. For details, reference is made to "Transactions of the Institute of Electronics and Communication Engineers of Japan, Opto and Quantum Electronics A, No. 857" or U.S. patent application Ser. No. 434,990, now issued as U.S. Pat. No. 4,252,841. Due to the internal p-n-p-n current confinement structure, DC-PBH LD does not require any stripe electrode structure for limiting a current injection region and this permits a p-side metal electrode to be formed all over the surface of a crystal prepared by epitaxial growth or a crystal surface which is entirely diffused with impurities for a higher surface concentration. Thus, the manufacturing process is simple and the yield, high. The simple manufacturing process, coupled with the excellent characteristics previously stated, enhances the reliability to such an extent that a light output of about 5 mW is stably attained even at a temperature as high as 70° C.

However, a problem has been left unsolved in the DC-PBH LD concerning its high frequency response characteristic. The frequency for the light output to be halved (−3 dB) is not higher than 200–300 MHz, which means a slow response for semiconductor laser applications. The problem, as the inventors found, originates from the fact that the p-n-p-n junction constituting the current confinement structure outside the active layer region has a relatively large capacitance, which allows high frequency components of the applied current to flow through the p-n-p-n junction around the active layer and not the active layer itself. The capacitance of the p-n-p-n junction may be reduced by reducing the impurity concentration in each layer and thereby enlarging the depletion layer of the p-n junction. However, just as it helps solve the problem regarding the high frequency response, it creates various other problems. The intermediate n- and p- layers of the p-n-p-n junction, which constitute the current confining structure, are locally not thicker than 0.3–0.5 $\mu$m so that the depletion layer is apt to become large enough to cause punch-through thereat. The gains of the p-n-p and n-p-n transistors of the p-n-p-n junction are increased to turn on the p-n-p-n junction. These, together with other causes, increase the proportion of current components, if DC components, which do not flow through the active layer, resulting in poor characteristics of the DC-PBH LD.

SUMMARY OF THE INVENTION

It is therefore an object of the present invention to provide a double-channel planar heterostructure semiconductor laser which is excellent in its high frequency response characteristic, performance and reliability due to its improved current confinement structure.

In accordance with the present invention, there is provided a semiconductor laser having a buried double-heterostructure which comprises a semiconductor substrate of a first conductivity type, a multi-layer double heterostructure including successively at least a first cladding semiconductor layer of the first conductivity type, an active semiconductor layer, and a second cladding semiconductor layer of a second conductivity type, the active semiconductor layer having a narrower bandgap than those of the first and second cladding semiconductor layers, the multi-layer double heterostructure having a stripe portion with channels formed along both sides of the stripe and extending through the second cladding semiconductor layer and active semiconductor layer to reach the first cladding layer, a current blocking layer formed on the multi-layer double heterostructure except for the top surface of the stripe portion, for blocking a current flow therethrough, the current blocking layer including a first blocking semiconductor layer of the second conductivity type and a second blocking semiconductor layer of the first conductivity type, the current blocking layer including a further semiconductor layer interposed between the first and second blocking semiconductor layers, and having a smaller carrier concentration than that of each of the first and second blocking semiconductor layers, a burying semiconductor layer of the second conductivity type which is grown to bury the top surface of the stripe portion and the current blocking layer, and a pair of electrodes for supplying a voltage to bias the semiconductor laser.

The above and other objects, features and advantages of the present invention will become apparent from the following detailed description taken with the accompanying drawings.

DETAILED DESCRIPTION OF THE EMBODIMENT

Figure 1:
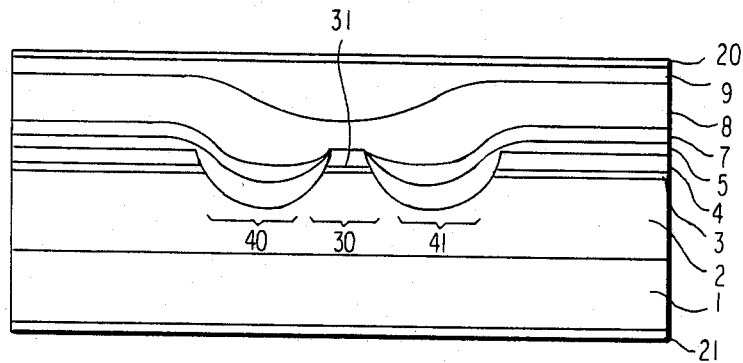
FIG. 1 is a cross-sectional view of a prior art buried-heterostructure semiconductor laser.

Referring to FIG. 1 of the drawings, a prior art InGaAsP DC-PBH LD is shown. The structure is essentially the same as that of the present invention, which will be described, except for the absence of one semiconductor layer. Details of the prior art structure, therefore, will become apparent from the description of an embodiment of the present invention and will not be described herein for simplicity. The same structural parts in FIG. 1 as those of the invention are designated by the same reference numerals.

Figure 2:
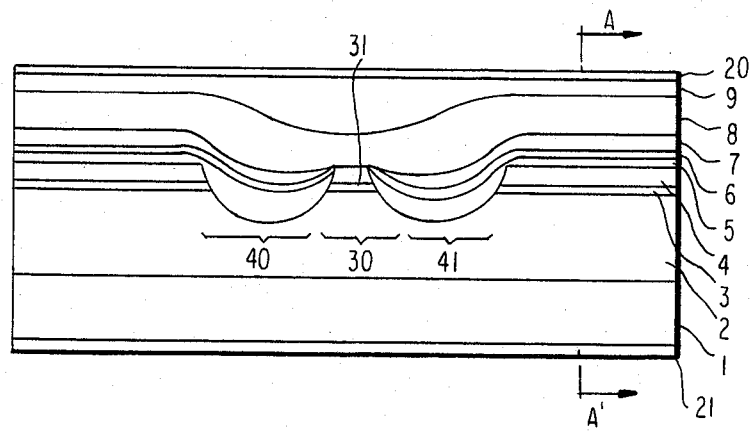
FIG. 2 is a cross-sectional view of an InGaAsP DC-PBH LD embodying the present invention.

Referring to FIG. 2, there is shown a double-heterostructure wafer comprising an n-InP substrate 1 (impurity concentration $2 \times 10^{18}$ cm$^{-3}$), an n-InP buffer layer 2 (impurity concentration $1 \times 10^{18}$ cm$^{-3}$, 5 μm thick) deposited on the (001) surface of the substrate 1 by a liquid-phase epitaxial (LPE) growth, an InGaAsP active layer 3 (non-doped, 0.1 μm thick) lattice-matched to InP and having bandgap energy of 1.3 μm in terms of emission wavelength, and a p-InP cladding layer 4 (impurity concentration $1 \times 10^{18}$ cm$^{-3}$, about 1 μm thick). This double-heterostructure multilayer wafer is processed by a Br-methanol solution to form two parallel channels 40 and 41 which extend parallel to the direction 110 and are about 7 μm wide and about 2 μm deep. A stripe mesa 30 is defined between the two channels 40 and 41 to a width of about 1.5 μm. In this structure, an InGaAsP active layer 31 approximately 2 μm wide is formed in the mesa stripe 30 to serve the function of a waveguide path.

A current blocking layer includes a first blocking layer 5, a second blocking layer 7 and a third blocking layer 6 interposed between the first and second blocking layers. The second LPE growth is performed so that a first blocking layer 5 of p-InP (impurity concentration $1 \times 10^{18}$ cm$^{-3}$, 0.5 μm thick in flat areas), a third blocking layer 6 of non-doped InP (non-doped, 0.2 μm thick in flat areas), and a second blocking layer 7 n-InP (impurity concentration $3 \times 10^{18}$ cm$^{-3}$) are sequentially deposited, each starting from the shoulders of the mesa stripe and terminating in the flat areas. The carrier concentration of the third blocking layer 6 should be less than the carrier concentrations of the first and second blocking layers 5 and 7 and preferably is less than $5 \times 10^{17}$ cm$^{-3}$. Further, a p-InP embedding layer 8 (impurity concentration $1 \times 10^{18}$ cm$^{-3}$, 2 μm thick in flat areas) is formed on the entire second blocking layer 7 and a p-InGaAsP cap layer 9 (1.2 μm in terms of emission wavelength, impurity concentration $5 \times 10^{18}$ cm$^{-3}$, 1 μm thick in flat areas), on the entire embedding layer 8. A p-electrode 20 and an n-electrode 21 are deposited by a known method using An-Zn and An-Ge-Ni compositions, respectively. A semiconductor laser pellet is prepared by cleaving the wafer to a cavity length of 250 μm and a lateral dimension of 300 μm.

Basically, the element thus prepared has an oscillation threshold $I_{th}$ of 15-30 mA, differential quantum efficiency $\eta_d$ of 50-60% and characteristic temperature To, expressed by $I_{th}$ $\alpha$exp (T/To), of about 70-90°K. These values were found almost the same as those particular to the prior art structure which lacked the third blocking layer 6. In the flat areas which do not include an emitting portion, the capacitance (Cp-n-p-n) of the p-n-p-n junction region was measured to be $2.5 \sim 3.0 \times 10^4$ pF/cm$^2$ in terms of unit area. The capacity of the p-n-p-n junction region in the whole pellet was about 20 pF. Concerning the frequency response characteristic, which was checked by small signal amplitude modulation (Im=0.5 mAp-p), it was shown that the frequency for the modulated light output to be reduced to one half (−3 dB) in the case of a direct current lies within the range of 650-800 MHz, which is a noticeable improvement over the conventional 200-300 MHz.

Figure 3A:
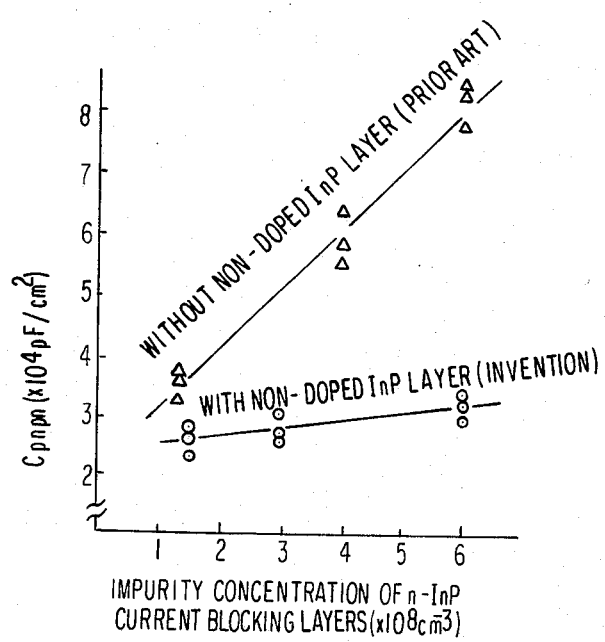
FIG. 3a is a graph showing a relationship between an impurity concentration in an n-InP confining layer and a junction capacitance of a p-n-p-n junction.
Figure 3B:
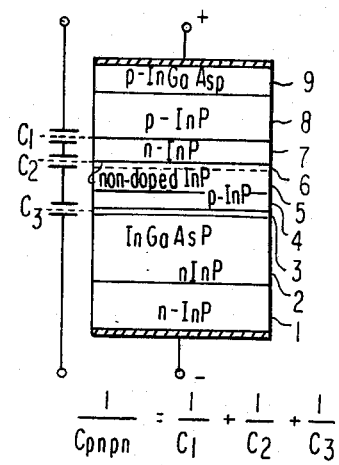
FIG. 3b is a schematic fragmentary section along line A-A' of FIG. 2 which is shown in combination with an equivalent circuit thereof.

The effect of the non-doped InP blocking layer 6 was evaluated. FIG. 3a is a graph representing the dependence of the capacitance Cp-n-p-n of the p-n-p-n junction region per unit area on the impurity concentration of the n-InP blocking layer. The impurity concentrations of the other layers are identical with those mentioned in conjunction with the embodiment of FIG. 2. As shown in FIG. 3b, the p-n-p-n junction has three p-n junctions whose capacitances are $C_1$, $C_2$ and $C_3$, respectively. The p-n junction capacity Ci (i=1~3) is expressed by the following equation, assuming a dual sided abrupt junction:

$$C_i = \sqrt{\frac{q\epsilon_s}{2} \cdot \frac{N_A \cdot N_D}{N_A + N_D} \cdot \frac{1}{V_{bi} \pm V}}$$

where q is an electron charge, $\epsilon_s$ a dielectric constant, $V_{bi}$ a built-in potential, V an applied voltage, $N_A$ an acceptor concentration, and $N_D$ a doner concentration. The sign "±" in the above equation is "+" for a forward bias and "−" for a reverse bias. The junction capacitance Cp-n-p-n is obtainable as a series connection of the capacitances $C_1$, $C_2$ and $C_3$.

When a forward bias is applied for activating the semiconductor laser, the intermediate p-n junction is subjected to a reverse bias to enlarge the depletion layer so that the capacity $C_2$ becomes the smallest. Therefore, of all the capacities $C_1$-$C_3$, the capacity $C_2$ is the main quantity which determines the junction capacity Cp-n-p-n. If the voltage V is fixed, the junction capacity depends on the impurity concentrations $N_A$ and $N_D$. A change in the impurity concentration in the blocking layer 7 is accompanied by a change in the capacitance $C_2$ and thereby the capacitance Cp-n-p-n. When the impurity concentration was increased from $1.3 \times 10^{18}$ cm$^{-3}$ to $6 \times 10^{18}$ cm$^{-3}$, the capacitance Cp-n-p-n showed an increase from $3.5 \times 10^4$ pF/cm$^2$ to $7.5 \times 10^4$ pF/cm$^2$ in the prior art structure of FIG. 1, which lacks the third blocking layer 6 (see FIG. 3a). In contrast, the structure with the blocking layer 6 in accordance with the present invention is successful to reduce the capacitance $C_2$ and thereby the capacitance Cp-n-p-n because the third blocking layer 6 forms an n-layer with an impurity concentration of about $5 \times 10^{16}$ cm$^{-3}$ or a p-layer with the same impurity concentration due to compensatory dispersion of Zn, an impurity, from the blocking layer 5 during epitaxial growth, the impurity concentration being reduced on one side of the p-n junction. The present invention also frees the junction capacitance from the influence of an impurity concentration of the second blocking layer 7. The capacitance Cp-n-p-n was actually measured to be $1.5 \sim 2.5 \times 10^4$ pF/cm$^2$ which was hardly effected by the impurity concentration of the second blocking layer 7 (see FIG. 3a).

Figure 4:
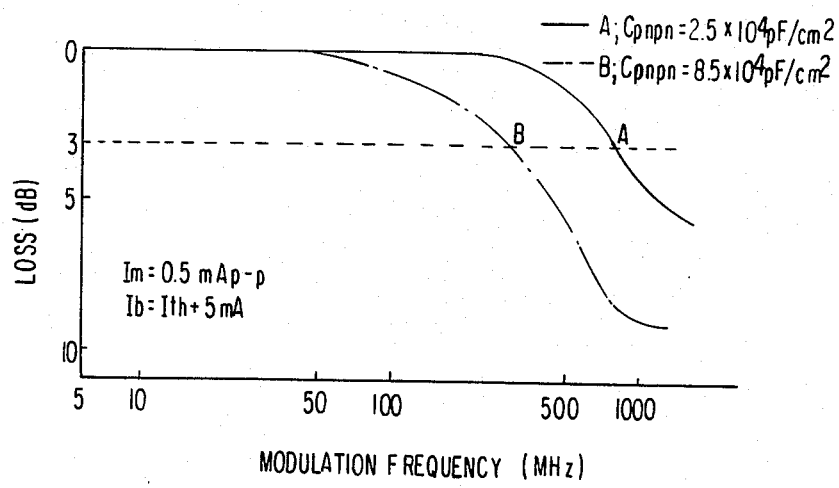
FIG. 4 is a chart representing a modulation frequency characteristic of a semiconductor laser in accordance with the present invention and that of a prior art semiconductor laser.

FIG. 4 shows curves representing measured frequency response characteristics of an element with the third blocking layer 6 and junction capacitance Cp-n-p-n of about $2.5 \times 10^4$ pF/cm$^2$ (the present invention) and an element with no third blocking layer 6 and a junction capacitance Cp-n-p-n of about $8.5 \times 10^4$ pF/cm$^2$. The curve A is the frequency response characteristic of the semiconductor laser in accordance with the present invention and the curve B, that of the prior art semiconductor laser. The measurement was carried out employing a DC bias voltage $I_b$ 5 mA higher than the oscillation threshold, and a modulating sinusoidal signal $I_m$ having an amplitude of 0.5 mA. Whereas the prior art element reduced the modulated light output by 3 dB at a frequency of 270 MHz, the element of the present invention did so at a frequency of 800 MHz. A remarkable improvement is thus achieved in high frequency characteristic by reducing the junction capacitance Cp-n-p-n with the non-doped InP third blocking layer 6.

Actually, even the prior art element without the third blocking layer may attain an improved high frequency characteristic if the impurity concentration of the n-InP second blocking layer 7 is made not higher than $1 \times 10^{18}$ cm$^{-3}$ to maintain the junction capacitance Cp-n-p-n not larger than $3 \times 10^4$ pF/cm$^2$. This, however, would result in a lower turn-on voltage of the p-n-p-n junction, a larger proportion of leakage current which does not contribute to light emission, and thereby produce unsatisfactory characteristics. When it comes to the element with the third blocking layer 6, the junction capacitance Cp-n-p-n hardly shows dependence on the impurity concentration of the second blocking layer 7 so that any desired impurity concentration may be selected for the layer 7 under the conditions which will offer the element good characteristics.

In summary, it will be seen that the present invention provides a DC-PBH LD which achieves a remarkable improvement in high frequency modulation characteristic over prior art one without any deterioration to the favorable basic characteristics and reliability of the latter. Such an improvement is due to a low carrier concentration blocking layer which is interposed between p-n-p-n blocking layers of the prior art structure.

Various modifications will become possible for those skilled in the art after receiving the teachings of the present disclosure without departing from the scope thereof. For example, the structure described may be combined with an oxide film stripe electrode structure or a stripe electrode structure in which the cap layer 9 is made n-type for selective diffusion, with a view to additionally enhancing the high frequency characteristic. While the non-doped layer has been shown and described as being formed by an epitaxial growth process, it may be replaced by an epi-layer having a low carrier concentration or may even be formed by another suitable method such as subjecting the surface of a P-InP blocking layer to impurity compensation by means of an n-type impurity to form a low carrier concentration layer.

What is claimed is:

1. A semiconductor laser having a buried double-heterostructure, comprising:
    a semiconductor substrate of a first conductivity type;
    a multi-layer double heterostructure including successively at least a first cladding semiconductor layer of said first conductivity type, an active semiconductor layer, and a second cladding semiconductor layer of a second conductivity type, said active semiconductor layer having a narrower bandgap than those of said first and second cladding semiconductor layers, said multi-layer double heterostructure having a stripe portion with channels which are formed along both sides of said strip portion and extedd through said second cladding semiconductor layer and active semiconductor layer to reach said first cladding layer, having remaining portions, outside said channels, including said first cladding, said active, and second cladding semiconductor layers;
    a current blocking layer formed on said channels and said remaining portions of said multi-layer double-heterostructure except for a top surface of said stripe portion, for blocking a current therethrough, said current blocking layer including a first blocking semiconductor layer of said second conductivity type and a second blocking semiconductor layer of said first conductivity type, said current blocking layer including a further semiconductor layer interposed between said first and second blocking semiconductor layers and extending along said first and second semiconductor layers over said channels and said remaining portions and having a smaller carrier concentration than that of each of the first and second blocking semiconductor layers;
    a burying semiconductor layer of said second conductivity type which is grown to bury said top surface of said stripe portion and said current blocking layer;
    resonant means for feeding light back in the opposite directions of the length of said stripe portion and parallel to said active semiconductor layer; and
    a pair of electrodes for supplying a voltage to bias said semiconductor laser.

2. The semiconductor laser as set forth in claim 1, wherein the carrier concentration of said further semiconductor layer is less than $5 \times 10^{17}$ cm$^{-3}$.

3. The semiconductor laser as set forth in claim 1, wherein said further semiconductor layer is a non-doped layer formed by epitaxial growth.

* * * * *

UNITED STATES PATENT AND TRADEMARK OFFICE
CERTIFICATE OF CORRECTION

PATENT NO. : 4,597,085

DATED : June 24, 1986

INVENTOR(S) : Ikoo MITO et al.

It is certified that error appears in the above-identified patent and that said Letters Patent is hereby corrected as shown below:

Column 4, line 28, delete "capacity" and insert --capacitance--;
line 29, delete "capacities" and insert --capacitances--;
line 29, delete "capacity" and insert --capacitance--.
Column 4, line 30, delete "capacity" and insert --capacitance--;
line 31, delete "capacity" and insert --capacitance--.
Column 6, line 23, after "current" insert --flow--;
line 45, delete "the" and insert --said--.

Signed and Sealed this

Twentieth Day of January, 1987

Attest:

DONALD J. QUIGG

Attesting Officer

Commissioner of Patents and Trademarks